(12) United States Patent
Kim

(10) Patent No.: US 7,678,689 B2
(45) Date of Patent: Mar. 16, 2010

(54) METHOD OF FABRICATING MEMORY DEVICE

(75) Inventor: Se Hyun Kim, Icheon-si (KR)

(73) Assignee: Hynix Semiconductor Inc., Icheon-si (KR)

(*) Notice: Subject to any disclaimer, the term of this patent is extended or adjusted under 35 U.S.C. 154(b) by 147 days.

(21) Appl. No.: 11/931,400

(22) Filed: Oct. 31, 2007

(65) Prior Publication Data
US 2009/0004810 A1    Jan. 1, 2009

(30) Foreign Application Priority Data
Jun. 27, 2007    (KR) ............... 10-2007-0063581

(51) Int. Cl.
*H01L 21/4763* (2006.01)
(52) U.S. Cl. ............... 438/629; 257/E21.649
(58) Field of Classification Search ........... 438/253, 438/396, 629, 631, 637; 257/E21.648, E21.649
See application file for complete search history.

(56) References Cited

U.S. PATENT DOCUMENTS

| | | | |
|---|---|---|---|
| 6,406,999 B1 * | 6/2002 | Esry et al. .......... | 438/669 |
| 7,358,182 B2 * | 4/2008 | Baks et al. .......... | 438/637 |
| 7,413,950 B2 * | 8/2008 | Kim .................. | 438/253 |
| 2005/0130385 A1 * | 6/2005 | Lee et al. .......... | 438/399 |
| 2005/0164503 A1 * | 7/2005 | Chan et al. ........ | 438/689 |
| 2006/0202302 A1 * | 9/2006 | Geffken et al. ..... | 257/522 |
| 2006/0211192 A1 * | 9/2006 | Cho et al. .......... | 438/238 |
| 2007/0218682 A1 * | 9/2007 | Lee et al. .......... | 438/639 |

FOREIGN PATENT DOCUMENTS

KR    1998-0011885    4/1998
KR    10-2004-0058779    7/2004

* cited by examiner

*Primary Examiner*—David Vu
(74) *Attorney, Agent, or Firm*—Marshall, Gerstein & Borun LLP

(57) ABSTRACT

Disclosed herein is a method of fabricating a memory device. The method includes forming an etch stop layer, bit lines, and a first hard mask pattern over a semiconductor substrate. A first SNC plug is formed between the bit lines, and an etch process is performed to reduce the height of the first hard mask pattern and the first SNC plug, to increase a top width of the first hard mask pattern, and to reduce a top width of the first SNC plug. The method also includes forming a second hard mask pattern on the first hard mask pattern, and forming a second SNC plug between the second hard mask patterns.

18 Claims, 3 Drawing Sheets

METHOD OF FABRICATING MEMORY DEVICE

CROSS REFERENCE TO RELATED APPLICATION

The priority of Korean patent application No. 10-2007-63581 filed on Jun. 27, 2007, the entire disclosure of which is incorporated by reference, is claimed.

BACKGROUND OF THE INVENTION

1. Field of the Invention

The present invention relates to a method of fabricating memory devices and, more particularly, to a method of fabricating memory devices, which method can prevent (a) a hard mask layer for a bit line from being bent, (b) a short between bit lines and lower electrodes, and (c) formation of bridges between storage node contact (SNC) plugs.

2. Brief Description of Related Technology

As the design rule of DRAM devices decreases, a method of forming a SNC employing a line-shaped etch mask emerges in order to widen an area where a lower region is opened.

The critical dimension (CD) of a semiconductor device pattern is being reduced as semiconductor devices become more highly integrated. In a conventional process of forming the line-shaped etch mask, however it is difficult to reduce the height of the line-shaped etch mask having a high height (that is, a hard mask layer for a bit line).

In particular, a hard mask layer (for the bit line) having a high aspect ratio has the following problems. First, the hard mask layer has a height of about 2500 angstrom (Å). Thus, at the time of an etch process of forming the line-shaped etch mask, the hard mask layer for the bit line is bent due to a high aspect ratio.

Second, the line-shaped etch mask does not properly serve as a mask due to the bent line-shaped etch mask when an excessive etch process is carried out in an etch process of forming lower electrodes, so that the bit line is partially exposed. This results in a short phenomenon between a lower electrode and a bit line. If misalignment occurs in this situation, then the short phenomenon between the lower electrode and the bit line becomes more profound.

Third, when conductive and barrier metal layers for a bit line are etched by employing a hard mask pattern for the line-shaped bit line, an upper region of the hard mask pattern is lost excessively and resultantly has a positive profile. If a process of forming spacers on the sidewalls of the hard mask pattern and the bit line is performed, then the spacers are also formed on the upper region of the hard mask pattern having the positive profile, resulting in bridges between SNC plugs. Consequently, reliability of the device becomes very vulnerable.

SUMMARY OF THE INVENTION

Disclosed herein is a method of fabricating a memory device. In one embodiment, the method includes forming landing plugs between gates of a semiconductor substrate, and forming an etch stop layer, a first conductive layer, and a first hard mask layer over the semiconductor substrate. The method also includes performing a first etch process to etch the first hard mask layer, the first conductive layer, and the etch stop layer to form a bit line. The method further includes forming a first spacer on sidewalls of the bit line, forming a first SNC plug between the bit lines, and performing a second etch process to reduce a height of the first hard mask layer and the first SNC plug. The method also includes forming a second hard mask pattern on the first hard mask layer, and forming a second SNC plug between the second hard mask patterns.

A barrier metal layer is further formed between the etch stop layer and the first conductive layer. The first hard mask layer is formed to a thickness of 1300 Å to 1500 Å. The first SNC plug is formed of a polysilicon film, for example. The second etch process increases a top width of the first hard mask layer and reduces a top width of the first SNC plug.

The second hard mask pattern is formed to a thickness of 1200 Å to 1600 Å. Each of the first hard mask layer and the second hard mask pattern has a trapezoid shape having a lower region wider than an upper region.

The method can also include forming a second spacer on sidewalls of the second hard mask pattern, after the second hard mask pattern is formed. The second SNC plug is formed of a polysilicon film, for example.

The method can also include, after the second SNC plug is formed, forming an insulating layer over the second hard mask pattern and the second SNC plug, performing a third etch process to form an open region through which the second SNC plug is exposed, and forming a second conductive layer on a surface of the open region, thus forming a lower electrode.

The insulating layer has a structure in which an oxide matter, a nitride matter, and an oxide matter are laminated. The second SNC plug is partially removed when the open region is formed.

According to another embodiment, a method of fabricating a memory device includes forming an etch stop layer, bit lines, and a first hard mask pattern over a semiconductor substrate, forming a first SNC plug between the bit lines, performing an etch process to reduce a height of the first hard mask pattern and the first SNC plug, to increase a top width of the first hard mask pattern, and to reduce a top width of the first SNC plug. The method also includes forming a second hard mask pattern on the first hard mask pattern, and forming a second SNC plug between the second hard mask patterns.

Because a hard mask layer is formed twice, the height of the hard mask layer remains intact, but the hard mask layer has a low aspect ratio at the time of an etch process of forming bit lines. Accordingly, the hard mask layer can be prevented from being bent and a short phenomenon between lower electrodes and the bit lines can be prevented because the bit lines are not exposed although an excessive etch process or misalignment occurs at the time of an etch process of forming an open region. Further, a chemical mechanical polishing (CMP) process may be additionally performed to remove a part of an upper region of a second hard mask pattern having a profile whose top is pointed and sidewalls are inclined. Accordingly, bridges between first SNC plugs (bridges that typically occur in the upper region of the second hard mask pattern having a profile whose top is pointed and sidewalls are inclined) can be removed.

Additional features of the disclosed invention may become apparent to those skilled in the art from a review of the following detailed description, taken in conjunction with the drawings, and the appended claims.

BRIEF DESCRIPTION OF THE DRAWINGS

For a more complete understanding of the disclosure, reference should be made to the following detailed description and accompanying drawings wherein.

Figure 1:
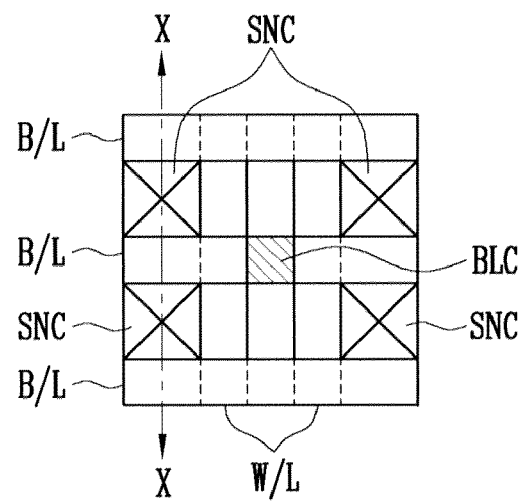
FIG. 1 is a plan view illustrating a region where bit lines and SNC plugs are formed in DRAM.

While the disclosed method is susceptible of embodiments in various forms, specific embodiments of the invention are illustrated in the drawings (and will hereafter be described), with the understanding that the disclosure is intended to be illustrative, and is not intended to limit the invention to the specific embodiments described and illustrated herein.

DETAILED DESCRIPTION OF THE INVENTION

With reference to FIG. 1, a plurality of gate electrode, for example word lines W/L are arranged in one direction. A plurality of bit lines B/L are arranged to intersect the word lines W/L. The word lines W/L and the bit lines B/L are electrically isolated by an insulating layer. The bit lines B/L are connected to a drain region (not shown), and SNC plugs are connected to a source region (not shown).

Figure 2A:
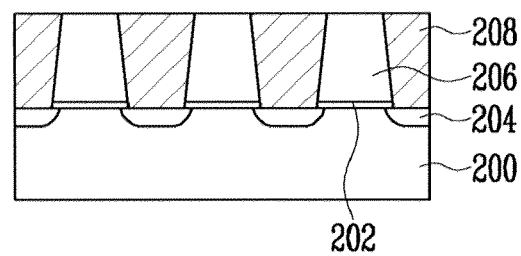
FIGS. 2A to 2F are cross-sectional views, taken along line X-X of FIG. 1, illustrating a method of fabricating a memory device according to an embodiment of the present invention.

Referring to FIG. 2A, an isolation layer (not shown) is formed on a semiconductor substrate 200 in which a plurality of elements for forming a semiconductor device are formed, thus defining an active region and an isolation region.

A gate (not shown) is formed on the semiconductor substrate 200. The gate includes a laminated gate insulating layer (not shown), a first conductive layer (not shown), and a first hard mask layer (not shown).

A self-aligned contact (SAC) nitride layer 202 is formed on the semiconductor substrate 200 including the gate. An ion implantation process employing an ion implantation mask (not shown) is performed to form source and drain junctions 204 between the gates.

A first insulating layer 206 is formed on the SAC nitride layer 202 to fill gaps present between the gates. After the first insulating layer 206 is formed, a CMP process is carried out until a top surface of the first hard mask layer is exposed. Consequently, the first insulating layer 206 remains only between the gates. The first insulating layer 206 and the SAC nitride layer 202 over the source and drain junctions 204 are etched to form contact holes through which the source and drain junctions 204 are opened. At this time, the SAC nitride layer 202 remains in a spacer (not shown) formed on sidewalls of the gate.

A second conductive layer is formed to gap-fill the contact holes. A CMP process is then performed to form landing plugs 208.

Figure 2B:
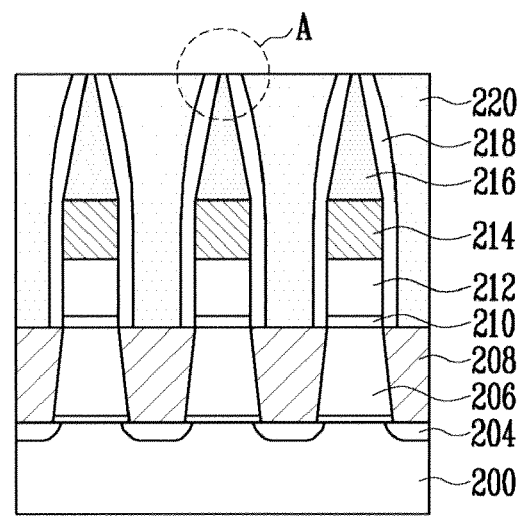

Referring to FIG. 2B, a first etch stop layer 210, a barrier metal layer 212, and a third conductive layer 214 for a bit line are formed over the semiconductor substrate 200 in which the landing plugs 208 are formed. The barrier metal layer 212 may be formed to a thickness of 310 Å to 510 Å, and the third conductive layer 214 may be formed using a tungsten (W) film, for example, to a thickness of 400 Å to 600 Å. A second hard mask layer 216 is formed on the third conductive layer 214. The second hard mask layer 216 may be formed using a nitride matter, for example, to a thickness of 1300 Å to 1500 Å.

The second hard mask layer 216 is etched to form a second hard mask pattern. An etch process, using the second hard mask pattern as an etch mask, is performed to pattern the third conductive layer 214, the barrier metal layer 212, and the first etch stop layer 210. This etch process forms a bit line connected to a plug formed in a drain. At this time, as the third conductive layer 214, the barrier metal layer 212, and the first etch stop layer 210 are patterned by using the second hard mask pattern 216 as the etch mask. An upper region of the second hard mask pattern 216 is etched excessively, so that it has a profile A whose top is pointed and sidewalls are inclined.

The second hard mask layer 216 is not formed to a thickness of 2500 Å as in the prior art. Instead, the second hard mask layer 216 is formed to a thickness of 1300 Å to 1500 Å. The aspect ratio of the second hard mask layer 216 is low at the time of an etch process and, therefore, the second hard mask layer 216 can be prevented from being bent.

A second insulating layer is formed over the semiconductor substrate 200 including the bit line. The second insulating layer may be formed of a nitride layer, for example. The second insulating layer is etched to form a first spacer 218 on the sidewalls of the bit line.

A fourth conductive layer is gap-filled between the bit lines. The fourth conductive layer may be formed of a polysilicon film, for example. A CMP process is performed until the second hard mask pattern 216 is exposed, thus forming a first SNC plug 220. The first SNC plug 220 has an upper region wider than a lower region due to the second hard mask pattern 216 having the profile A whose top is pointed and sidewalls are inclined, so that a bridge may be formed between the first SNC plugs 220.

Figure 2C:
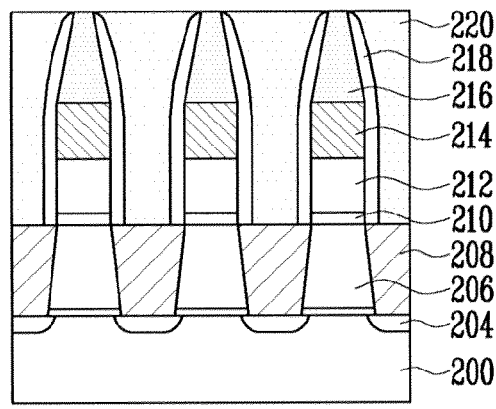

Referring to FIG. 2C, an additional CMP process is performed to reduce the thickness of the second patterned hard mask layer 216 to 1100 Å to 1300 Å. The CMP process causes a top width of the patterned second hard mask layer 216 to increase and a top width of the first SNC plug 220 to decrease, to increase the distance between the first SNC plugs 220 is widened and to prevent formation of a bridge between adjacent SNC plugs 220. As the first spacer 218 is removed, the patterned second hard mask layer 216 is exposed. Accordingly, a bridge that has formed between the upper regions of the patterned second hard mask layer 216, that is, between the first SNC plugs 220, can be removed. Furthermore, the patterned second hard mask layer 216 has a trapezoid shape having a wide lower region due to the additional CMP process.

Figure 2D:
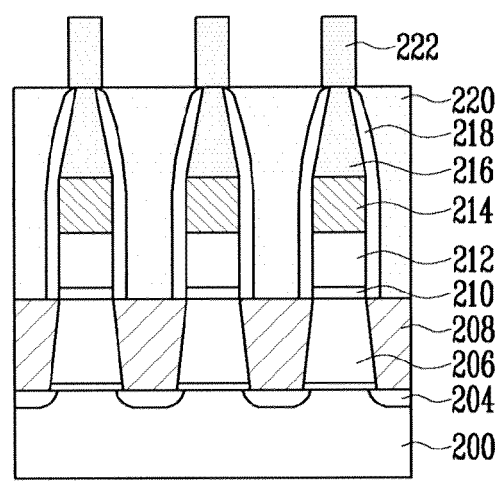

Referring to FIG. 2D, a third hard mask layer is formed over the first SNC plug 220 and the patterned second hard mask layer 216. The third hard mask layer may be formed using a nitride matter, for example, to a thickness of 1200 Å to 1600 Å. A third hard mask pattern 222 is formed on the second hard mask pattern 216 by performing an etch process. The third hard mask pattern 222 may have a trapezoid shape having a wide lower region. As the third hard mask pattern 222 is additionally formed on the patterned second hard mask layer 216 as described above, the hard mask pattern can be prevented from being bent due to a high aspect ratio while the height of the hard mask pattern comprised of the patterned second hard mask layer 216 and the third hard mask pattern 222 remains intact.

Figure 2E:
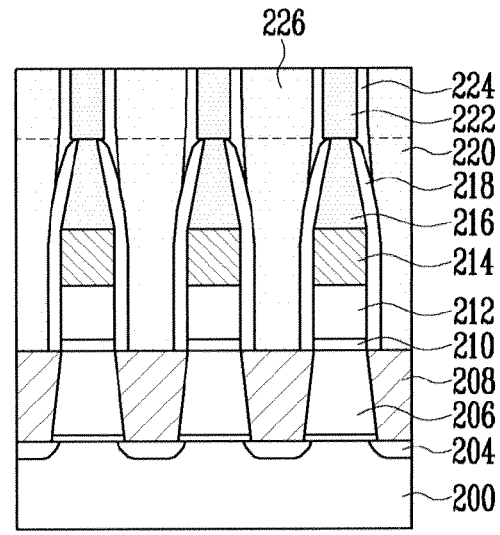

Referring to FIG. 2E, a third insulating layer is formed over the semiconductor substrate 200 including the third hard mask pattern 222. The third insulating layer may be formed using a nitride layer, for example. The third insulating layer is etched to form a second spacer 224 on the sidewalls of the third hard mask pattern 222.

A fifth conductive layer is gap-filled between the third hard mask patterns 222. The fifth conductive layer may be formed using a polysilicon film, for example. A CMP process is performed until the third hard mask patterns 222 are exposed, thus forming second SNC plugs 226.

Figure 2F:
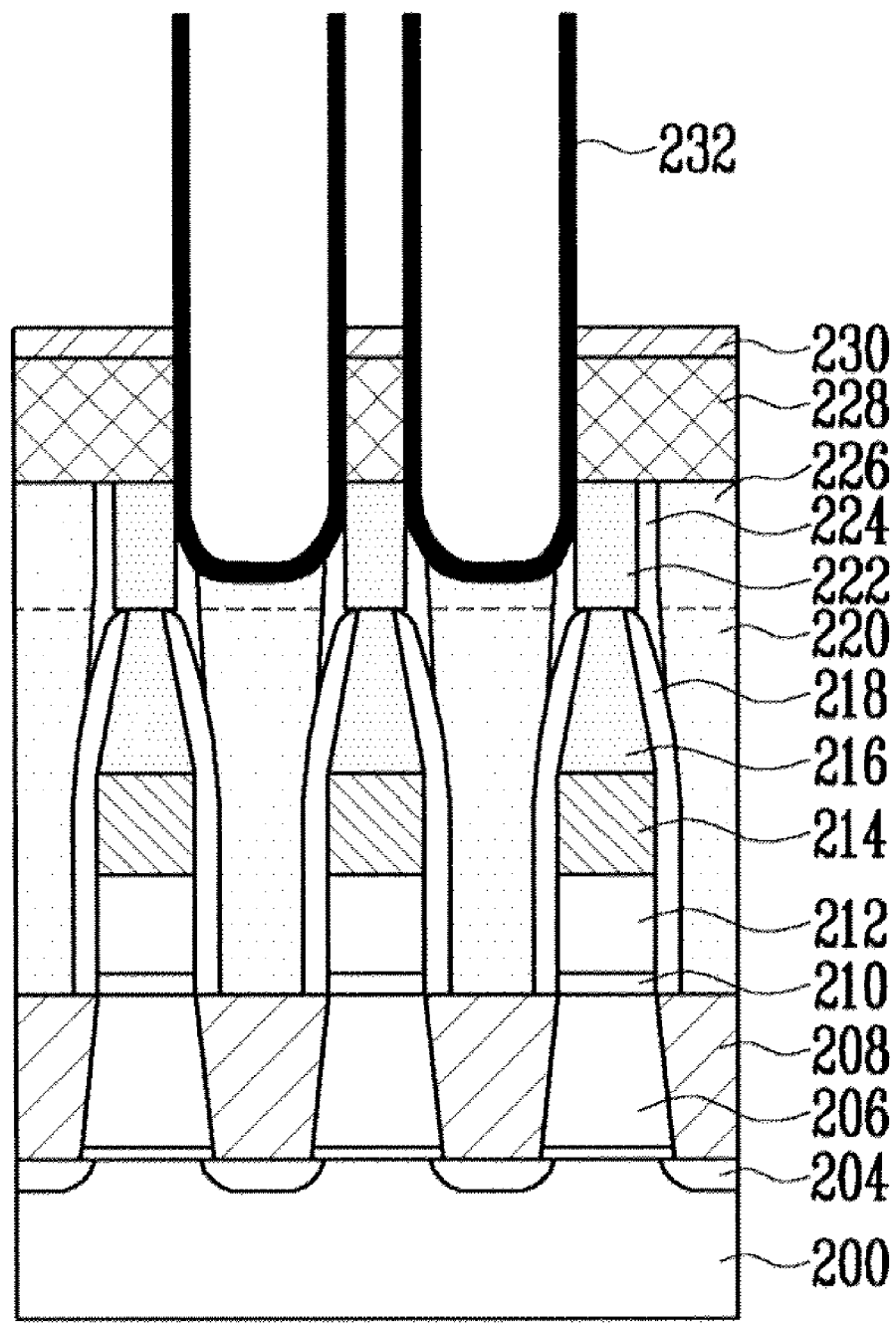

Referring to FIG. 2F, a fourth insulating layer 228, a second etch stop layer 230, and a fifth insulating layer (not shown) are formed over the semiconductor substrate 200 including the second SNC plug 226 and the third hard mask pattern 222. The fourth insulating layer 228 and the fifth insulating layer may be formed using an oxide matter, for example, and the second etch stop layer 230 may be formed using a nitride matter, for example.

The fifth insulating layer, the second etch stop layer 230, and the fourth insulating layer 228 are etched o that the second SNC plugs 226 are exposed to form an open region. The second SNC plugs 226 are partially removed when the open region is formed. At the time of the process of forming the third hard mask pattern 222, the third hard mask pattern 222 has a lower region having a width wider than that of an upper region. Accordingly, the bit lines are not exposed although an excessive etch process or misalignment occurs at the time of the etch process of forming the open region.

A sixth conductive layer is formed on surfaces of the open region and the fifth insulating layer. A CMP process is then performed until the fifth insulating layer is exposed. The sixth conductive layer may be formed using a titanium nitride (TiN) layer, for example. The fifth insulating layer is removed to form lower electrodes 232. As mentioned earlier, because the bit lines are not exposed, a short between the lower electrode 232 and the bit line can be prevented.

As described above, the hard mask layer is not formed to a thickness of 2500 Å at once as in the prior art, but is formed at two times. Accordingly, the height of the hard mask layer remains intact, but the hard mask layer has a low aspect ratio at the time of an etch process of forming a bit line, so that the hard mask layer is not bent.

Further, an upper region of the second hard mask pattern having a profile whose top is pointed and sidewalls are inclined is removed by CMP process. Accordingly, a bridge between the first SNC plugs occurring in the upper region of the second hard mask pattern can be removed.

In addition, the hard mask layer is not bent due to a high aspect ratio, and a lower region of the third hard mask pattern has a width wider than that of an upper region. Thus, the bit lines are not exposed, although an excessive etch process or misalignment occurs at the time of an etch process of forming the open region. Accordingly, a short between the lower electrodes and the bit lines can be prevented.

The foregoing description is given for clearness of understanding only, and no unnecessary limitations should be understood therefrom, as modifications within the scope of the invention may be apparent to those having ordinary skill in the art.

What is claimed is:

1. A method of fabricating a memory device, the method comprising:
   forming landing plugs between gates on a semiconductor substrate;
   forming an etch stop layer, a first conductive layer, and a first hard mask layer over the semiconductor substrate;
   etching the first hard mask layer to form first hard mask patterns;
   performing a first etch process to form bit lines by etching the first conductive layer and the etch stop layer using the first hard mask patterns as an etch mask;
   forming a first spacer on sidewalls of the bit line;
   gap-filling a second conductive layer between the bit lines;
   forming a first storage node contact (SNC) plug between the bit lines by polishing the second conductive layer until the first hard mask patterns are exposed;
   performing a second etch process to reduce a height of the first hard mask patterns and the first SNC plug;
   forming the second hard mask layer over the first hard mask patterns and the first SNC plug;
   etching the second hard mask layer to form second hard mask patterns on the first hard mask patterns; and
   forming a second SNC plug between the second hard mask patterns.

2. The method of claim 1 further comprising forming a barrier metal layer between the etch stop layer and the first conductive layer.

3. The method of claim 1, wherein the first hard mask layer has a thickness of 1300 Å to 1500 Å.

4. The method of claim 1, wherein the first SNC plug is formed of a polysilicon film.

5. The method of claim 1, wherein the second etch process increases a top width of the first hard mask patterns and reduces a top width of the first SNC plug.

6. The method of claim 1, wherein the second hard mask patterns have a thickness of 1200 Å to 1600 Å.

7. The method of claim 1, wherein each of the first hard mask patterns and the second hard mask patterns has a trapezoid shape having a lower region wider than an upper region.

8. The method of claim 1 further comprising forming a second spacer on sidewalls of the second hard mask patterns after the second hard mask patterns are formed.

9. The method of claim 1, wherein the second SNC plug is formed of a polysilicon film.

10. The method of claim 1 further comprising, after the second SNC plug is formed:
    forming an insulating layer over the second hard mask patterns and the second SNC plug;
    performing a third etch process to form an open region through which the second SNC plug is exposed; and
    forming a third conductive layer on a surface of the open region, thus forming a lower electrode.

11. The method of claim 10, wherein the insulating layer has a structure in which an oxide matter, a nitride matter, and an oxide matter are laminated.

12. The method of claim 10 further comprising partially removing the second SNC plug at the time of performing the third etch process.

13. A method of fabricating a memory device, the method comprising:
    forming an etch stop layer, bit lines, and first hard mask patterns over a semiconductor substrate;
    gap-filling a conductive layer between the bit lines;
    forming a first SNC plug between the bit lines by polishing the conductive layer until the first hard mask patterns are exposed;
    performing an etch process to reduce a height of the first hard mask patterns and the first SNC plug to increase a top width of the first hard mask patterns, and to reduce a top width of the first SNC plug;
    forming the second hard mask layer over the first hard mask patterns and the first SNC plug;
    etching the second hard mask layer to form second hard mask patterns on the first hard mask patterns; and
    forming a second SNC plug between the second hard mask patterns.

14. The method of claim 13, wherein the first hard mask patterns have a thickness of 1300 Å to 1500 Å.

15. The method of claim 13, wherein the first SNC plug is formed of a polysilicon film.

16. The method of claim 13, wherein the second hard mask patterns have a thickness of 1200 Å to 1600 Å.

17. The method of claim 13, wherein each of the first and the second hard mask patterns has a trapezoid shape having a lower region wider than an upper region.

18. The method of claim 13, wherein the second SNC plug is formed of a polysilicon film.

* * * * *